(12) United States Patent
Kramer et al.

(10) Patent No.: US 6,252,802 B1
(45) Date of Patent: Jun. 26, 2001

(54) FLOATING GATE MOS TRANSISTOR CHARGE INJECTION CIRCUIT AND COMPUTATION DEVICES INCORPORATING IT

(75) Inventors: Alan Kramer, Berkeley, CA (US); Roberto Canegallo, Tortona (IT); Mauro Chinosi, Cologno Monzese (IT); Giovanni Gozzini, Palazzolo (IT); Pier Luigi Rolandi, Monleale (IT); Marco Sabatini, Agrate Brianza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/636,397

(22) Filed: Aug. 9, 2000

Related U.S. Application Data

(63) Continuation of application No. 09/373,813, filed on Aug. 13, 1999, which is a continuation of application No. 08/940,278, filed on Sep. 30, 1997, now Pat. No. 5,946,235.

(30) Foreign Application Priority Data

Sep. 30, 1996 (EP) .................................................. 96830492

(51) Int. Cl.[7] .................................................... G11C 7/00
(52) U.S. Cl. ............................. 365/185.18; 365/185.01; 365/185.03
(58) Field of Search .................... 365/185.01, 185.03, 365/185.15, 185.18, 185.26

(56) References Cited

U.S. PATENT DOCUMENTS

| | | | |
|---|---|---|---|
| 4,661,929 | 4/1987 | Aoki et al. | 365/189 |
| 5,253,196 | 10/1993 | Shimabukuro et al. | 365/45 |
| 5,289,401 | 2/1994 | Shima | 365/45 |
| 5,592,418 | 1/1997 | Sabatini et al. | 365/185.18 |
| 5,946,235 | * 8/1999 | Kramer et al. | 365/185.19 |

OTHER PUBLICATIONS

Kramer et al., "Flash–Based Programmable Nonlinear Capacitor for Switched–Capacitor Implementations of Neural Networks," in *Technical Digest of the International Electron Devices Meeting*, IEEE, San Francisco, Dec. 11–14, 1994, pp. 449–452.

* cited by examiner

Primary Examiner—Terrell W. Fears
(74) Attorney, Agent, or Firm—Theodore E. Galanthay; Robert Iannucci; Seed IP Law Group, PLLC

(57) ABSTRACT

The charge injection circuit of this invention comprises at least one pair of floating gate MOS transistors having source and drain terminals which are coupled together and to an injection node, and at least one corresponding pair of generators of substantially step-like voltage signals having an initial value and a final value, and having outputs respectively coupled to the control terminals of said transistors. The signal generators are such that the initial value of a first of the signals is substantially the equal of the final value of a second of the signals, and that the final value of the first signal is substantially the equal of the initial value of the second signal.

17 Claims, 3 Drawing Sheets

FLOATING GATE MOS TRANSISTOR CHARGE INJECTION CIRCUIT AND COMPUTATION DEVICES INCORPORATING IT

CROSS REFERENCE TO RELATED APPLICATIONS

This application is a continuation of U.S. patent application Ser. No. 09/373,813, filed on Aug. 13, 1999; which is a continuation of U.S. patent application Ser. No. 08/940,278, filed on Sep. 30, 1997, and issued on Aug. 31, 1999 as U.S. Pat. No. 5,946,235.

TECHNICAL FIELD

This invention relates to a charge injection circuit, as well as to computing devices incorporating the circuit.

BACKGROUND OF INVENTION

There are many applications in the field of circuit electronics for charge injection circuits, i e., for circuits which are capable of injecting/extracting a given amount of electric charge into/from a node in an electric network. Among these is, for instance, the Manhattan distance computation array described in A Kramer et al., "Flash-Based Programmable Nonlinear Capacitor for Switched-Capacitor Implementation of Neural Netwoks", IEDM Tech. Dig., pages 17.6.1–4, December 1994.

FIG. 2 of that article shows a charge injection circuit based on the use of a floating gate MOS transistor connected as a capacitor, wherein the injected/extracted charge is dependent on the threshold voltage of the transistor and the width of the voltage step supplied to its control terminal.

FIG. 3 of that article shows an absolute value function computing circuit which is similar to the circuit in FIG. 2. This comprises two floating gate MOS transistors having source and drain terminals which are connected together and to the inverting input of an operational amplifier, and two generators of step-like voltage signals having outputs respectively connected to the control terminals of the two MOS transistors. Accordingly, each MOS transistor operates as an independent charge injector.

As shown in the article, the step width and threshold voltage of the transistors are such that an input-output characteristic is produced in the form of an absolute value function; in particular, the two electric characteristics of the two MOS transistors serve to respectively implement the two branches of the absolute value function, with both steps having a zero initial value.

The article also brings out a limitation of that circuit, namely the fact that floating gate MOS transistors of the standard type have a very high parasitic overlap capacitance which dominates over the channel capacitance. This is a cause of considerable error in the charge injection. One way of partially solving this problem, as suggested in the article, is to use a MOS transistor of a particular type, that is a MOS transistor having its floating gate extended outside the channel area (included between the source and the drain areas) in the vertical direction relative to the channel length, but substantially non-overlapping the source and drain areas. Such a MOS transistor is also known, defined as a non-volatile memory cell, from European Patent Application EP 0 661 756 A1. In this way, the channel capacitance is increased with respect to the parasitic capacitance, but not to a sufficient extent to make it negligible.

SUMMARY OF THE INVENTION

It is an object of the present invention to provide a programmable type of charge injection circuit with reduced charge injection error.

According to principles of the present invention, at least two floating gate MOS transistors are driven by at least two corresponding generators of substantially step-like voltage signals, such that the initial value of a first of these signals is substantially equal to the initial value of a second of these signals, and that the final value of the first signal is substantially equal to the initial value of the second signal.

This circuit has a major advantage in that it achieves its objectives without involving any significant increase in circuit complexity compared to the prior art.

BRIEF DESCRIPTION OF THE DRAWINGS

The invention will be more clearly apparent from the following description of an embodiment thereof, to be read in conjunction with the accompanying drawings.

DETAILED DESCRIPTION

Figure 2:
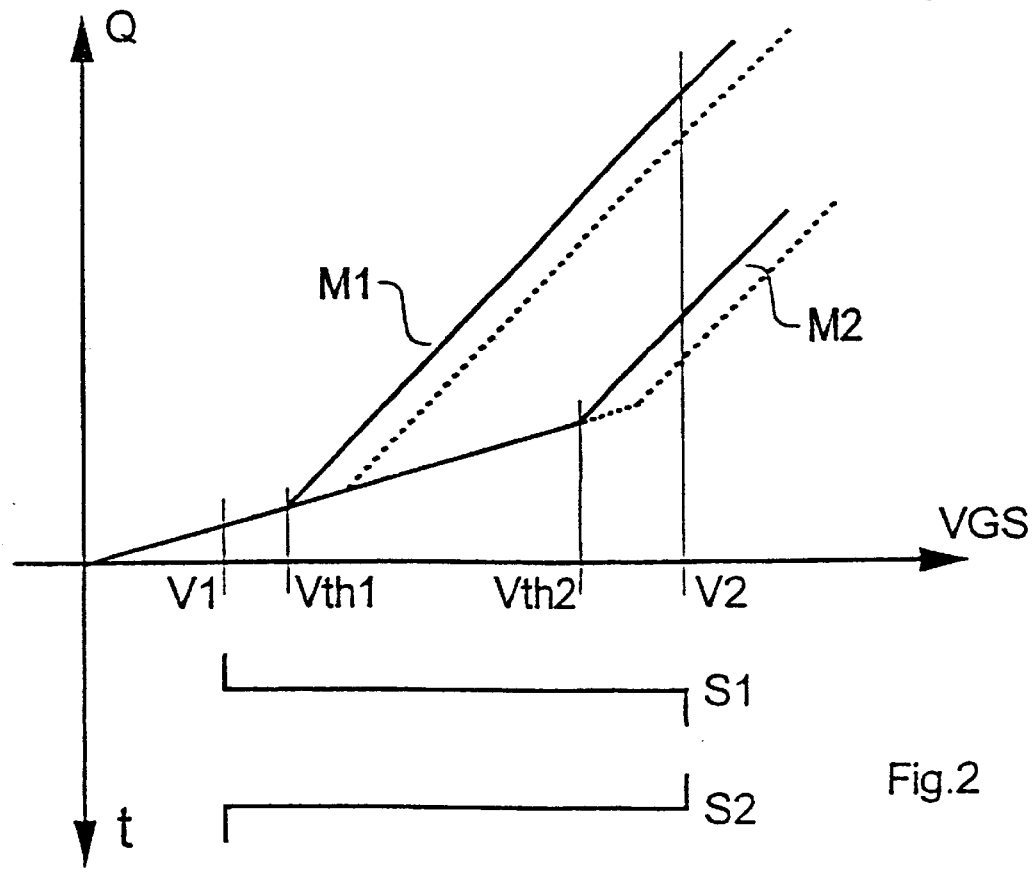
FIG. 2 illustrates the voltage vs. charge characteristics of the floating gate MOS transistors in the circuit of FIG. 1.

Shown in FIG. 2 of the drawings are the characteristics of gate-source VGS voltage vs. charge at the control terminal for two floating gate MOS transistors, M1 and M2, which are capacitor connected and have two different threshold voltages, Vth1 and Vth2. These characteristics include a first, shallow section due to parasitic overlap capacitance, and a second, steeper section due both to parasitic capacitance and channel capacitance; the second section starts at the threshold voltage, since at lower voltage values, no conductive channel is present between the source terminal and the drain terminal.

These characteristics are somewhat idealized, in that phenomena of a higher order contribute to rounding them off and leaving them non-linear.

If the control terminal of such a MOS transistor has applied to it a step-like voltage signal, the amount of injected/extracted charge depends on the initial and final values of the signal, channel capacitance Cch, parasitic capacitance Cpar, and the threshold voltage value. All that is required to change this amount of charge in a simple manner is that the threshold voltage be varied; unfortunately, the contribution from parasitic capacitance, is difficult to control and can be substantial.

Figure 1:
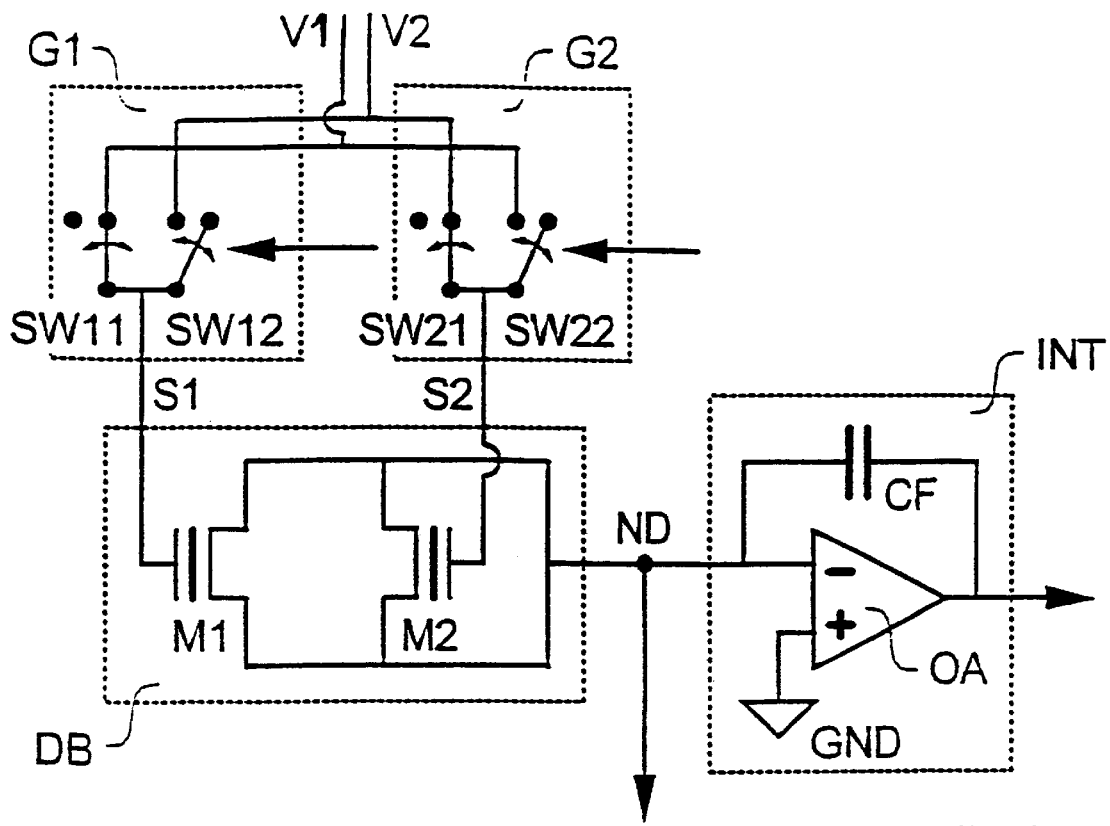
FIG. 1 is a schematic diagram of a charge injection circuit according to the invention.

Referring to FIG. 1, a charge injection circuit of an embodiment according to this invention, which virtually cancels the effect of the parasitic capacitance, comprises at least one pair DB of floating gate MOS transistors M1, M2 having source and drain terminals which are coupled together and to an injection node ND; and at least one corresponding pair of generators G1, G2 of substantially step-like voltage signals S1, S2 having an initial value and a final value, and having outputs respectively coupled to the control terminals of the transistors M1 and M2. The generators G1 and G2 generate values such that the initial value of a first, S1 in the example, of said signals is substantially equal to the final value of a second, S2 in the example, of said signals, and that the final value of the first signal i.e., S1, is substantially equal to the initial value of the second signal, i.e., S2.

Referring to FIG. 2, if the control terminal of the transistor M1 is supplied the step-like voltage signal S1 having the initial value V1 and final value V2, the transistor M1 will effect the extraction from the node ND of an amount of charge given by:

i $Q=(Vth1-V1)*Cpar+(V2-Vth1)*(Cpar+Cch)$;

and if the control terminal of the transistor M2 is supplied the step-like voltage signal S2 having the initial value V2 and final value V1, the transistor M2 will effect the injection into the node ND of an amount of charge given by:

$-Q=(Vth2-V1)*Cpar+(V2-Vth2)*(Cpar+Cch)$.

Therefore, the net extracted charge is given by:

$Qtot=(Vth2-Vth1)*Cch$.

These formulae will be more applicable and the results more precise, the more similar the transistors M1 and M2 are to each other. It is preferred that they are physically close together on the same substrate. Thus, the amount of charge is independent of the parasitic capacitance, as well as of the values V1 and V2.

A further advantage of this injection circuit is that, if the range of values V1–V2 delimited by the initial and final values of the signals S1 and S2 includes the values of the threshold voltages Vth1 and Vth2 of the transistors M1 and M2, as in the example of FIG. 2, the amount of charge also is, as first approximation, independent of the operating temperature of the circuit. In fact, if the circuit undergoes a change in temperature, the two threshold voltages of the two MOS transistors undergo substantially the same change, as illustrated by the dash lines in FIG. 2, and the difference between them will remain practically unaltered.

If the MOS transistors M1 and M2 have their floating gate extended outside the channel area in the vertical direction relative to the channel length, but substantially not overlapping the source and drain areas, as described in the aforementioned European Patent Application EP 0 661 756 A1, then the channel capacitance will increase considerably both in absolute terms and relative to the parasitic capacitance, which instead remains constant, as will the amount of charge shifted for a given difference between the threshold voltages.

As highlighted by the formulae, the actual shape of the steps is relatively unimportant because what does matter, as a first approximation, are the initial and final values. Accordingly, even some odd shapes, e.g., showing shallow edges or oscillations and/or overshoots, are acceptable. Likewise, the timing in supplying the steps to the control terminals is relatively unimportant because what does matter, as a first approximation, is the charge shifted once the effect of both steps has ceased. It should be noted, however, that the less the potential constancy likely to be maintained circuit-wise at the node ND, the more helpful it is for the shape and timing of the signals to be the same and also to approach the ideal condition, that is, steps with a vertical edge and being synchronous with each other.

Any inequality of the initial and final values may result in some errors which will of course, be smaller, the lesser the difference. Two truly identical ideal voltages, are nearly physically impossible to obtain so there may be some slight differences, but the present circuit reduces the effect on any such naturally occurring differences.

More than two MOS transistors, with or without a floating gate, could be used, but they are best used in pairs, in order to automatically ensure that the parasitic capacitances are balanced. Such MOS transistors should have source and drain terminals coupled together and to the injection node ND, and be driven as previously described for the first pair.

Advantageously, the charge injection circuit of this invention may further comprise bias circuitry INT connected to the node ND and effective to hold it at a substantially constant potential. In this way, the voltage at the control terminal of the MOS transistors can be made to correspond to their gate-source voltage VGS which is functionally tied to the charge at the control terminal by a characteristic similar to that shown in FIG. 2. Thus, the amount of charge shifted can be readily predicted since it does not depend on the initial and final potentials of the node ND.

A simple and effective implementation of the circuitry INT provides an operational amplifier OA and an electric network, in particular a capacitor CF, connected thereto in negative feedback relationship. The inverting input of the amplifier OA is connected to the node ND, and the non-inverting input is connected to a reference potential, in particular to the ground GND, for simplicity. If the initial value, ie., before the application of the step-like signals, of the voltage across the capacitor CF is zero, the output of the amplifier OA will, after applying such signals, present a voltage signal whose value is directly proportional to the amount of charge shifted. This is, therefore, a charge integrating circuit.

A simple and effective implementation of the generators G1 and G2 provides four switches SW11, SW12, SW21, SW22. These generators are each adapted to receive, at two inputs, two respective reference potentials V1 and V2, and these switches are each adapted to alternately couple their output to such inputs. With this circuit it can be easily arranged for the shape and timing of the signals S1 and S2 to approach the ideal condition, that is, steps with a vertical edge which are synchronous with each other.

An advantage of the injection circuit of this invention is that the amount of charge shifted is easily set and changed. In fact, the threshold voltage of the floating gate MOS transistors can be set and changed electrically. It should be recalled, in fact, that a floating gate MOS transistor is the basic element of semiconductor memory cells of the EPROM (Erasable Programmable Read-Only Memory), EEPROM (Electrically Erasable Programmable Read-Only Memory), and FLASH EEPROM types, and for any technical details about the write and erase mode and circuitry, generally known as programming, reference can be made to the pertinent literature.

Figure 4:
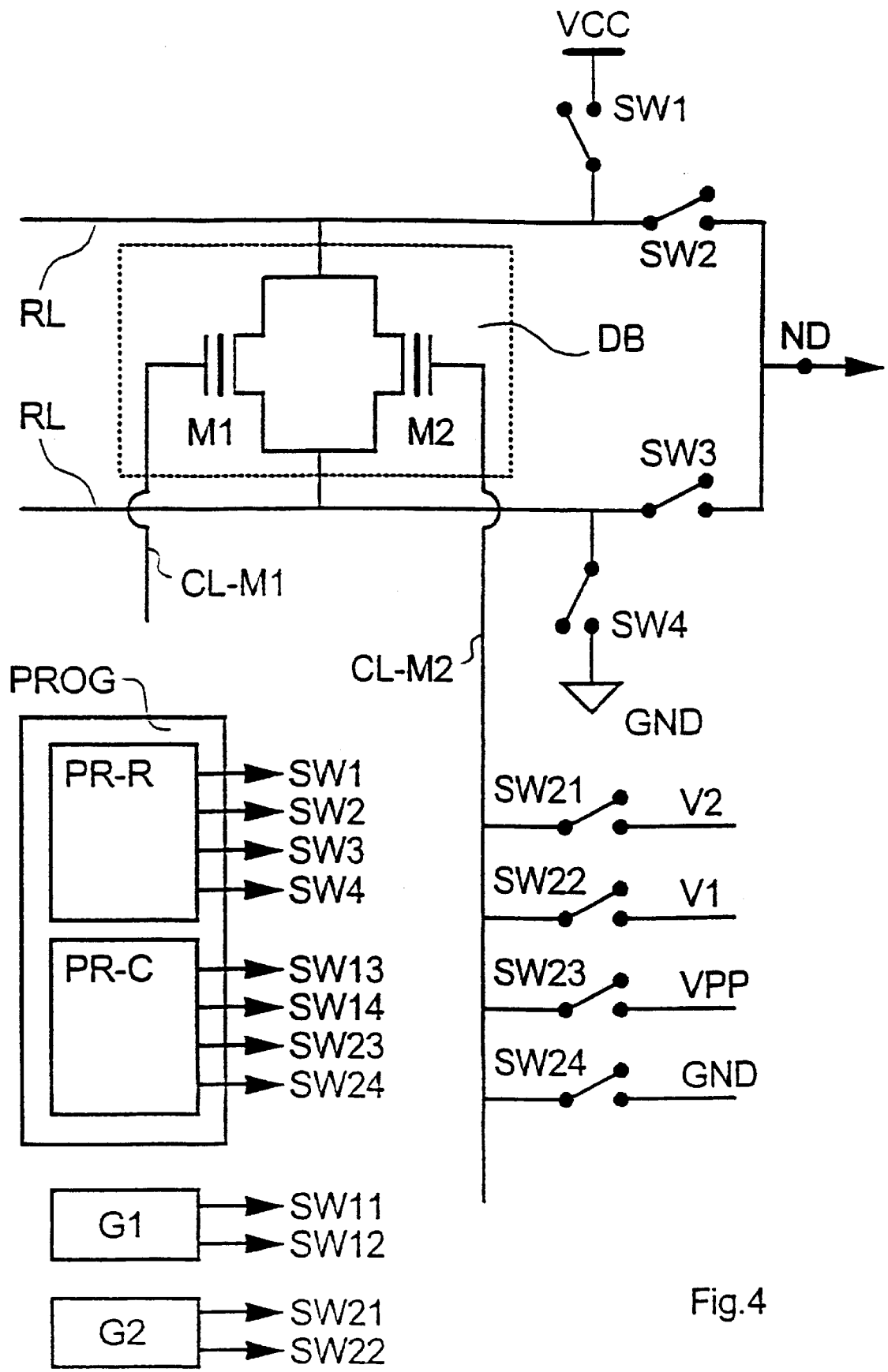
FIG. 4 is a schematic diagram of a detail of the device shown in FIG. 3.

In order to permit such alteration, it is necessary that the injection circuit further, comprises circuitry PROG for programming the floating gate MOS transistors which is controllable to uncouple them from the node ND and couple them to program references, VCC, GND, VPP in the example of FIG. 4.

Referring to FIG. 4, the drain terminals of the transistors M1 and M2 are connected to a supply reference VCC through a switch SW1, and to the node ND through a switch SW2; while the source terminals of the transistors M1 and M2 are connected to the node ND through a switch SW3, and to a ground reference GND through a switch SW4. The control terminal of the transistor M2 is connected to the reference V2 through the switch SW21 (which actually forms a part of the generator G2), to the reference V1 through the switch SW22 (which actually forms a part of the generator G2), to a write reference VPP through a switch SW23 and to the ground reference GND through a switch SW24. Similar connections are also provided for the control terminal of the transistor M1 through switches SW11, SW12, SW13, SW14. In addition or alternatively to the write reference, there may be an erase reference VNN connected to the control terminals of the two transistors through respective switches. These switches are controlled electrically through the circuitry PROG, which is split into row PR-R and column PR-C sections.

The accuracy of such an injection circuit would improve with the programming accuracy of the MOS transistor threshold voltages and the assurance of no charge losses, i.e., that all the charge being shifted to/from the main conduction terminals of the MOS transistors goes to or comes from the node ND. The presence in the program circuitry of switches with low Ron and high Roff, as are those implemented with MOS transistors, is of no hindrance to the obtainment of good accuracy.

An advantageous application of the injection circuit according to the invention relates, as mentioned above, to electronic computation devices.

Figure 3:
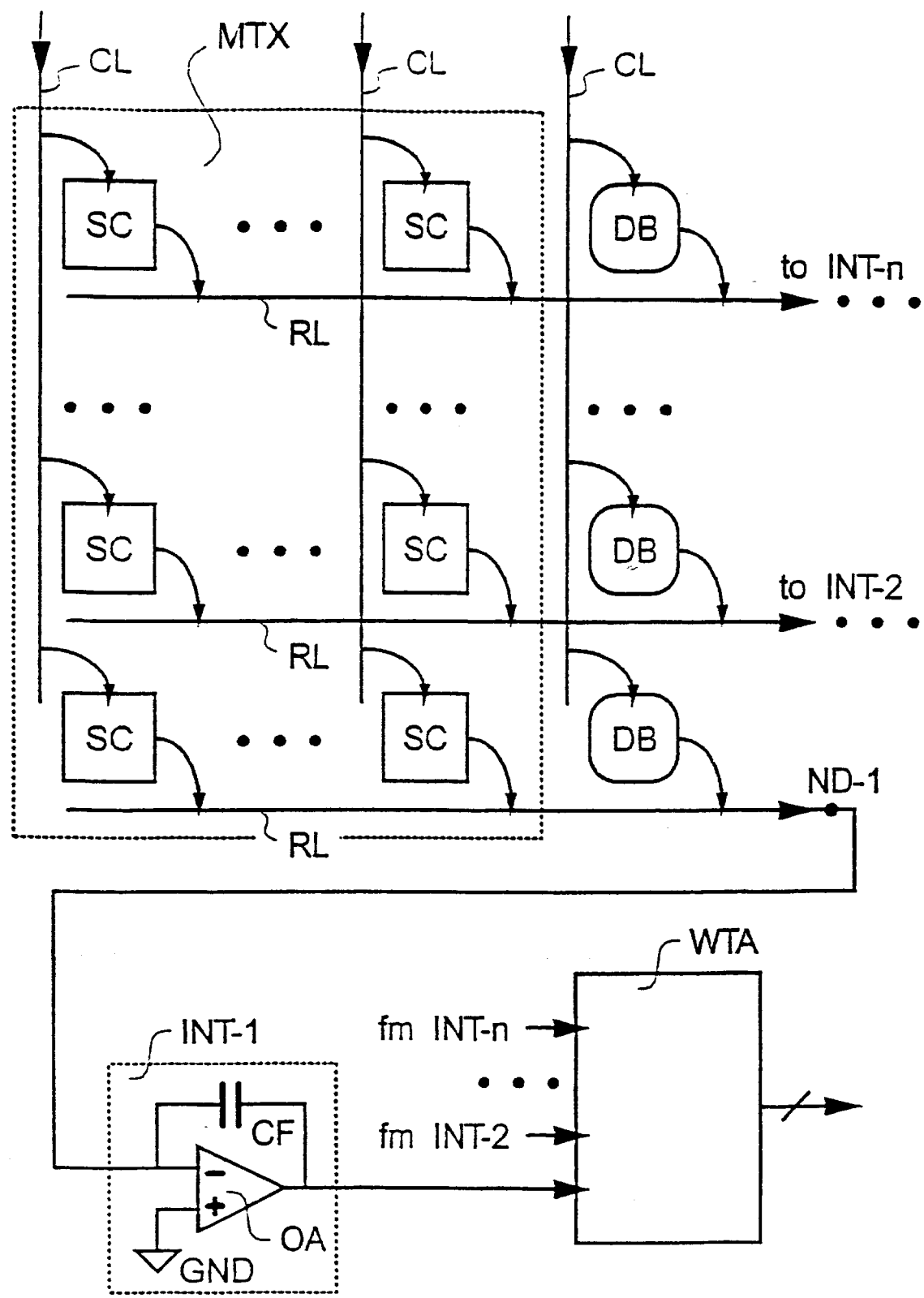
FIG. 3 is a block diagram of a computation device according to the invention.

With reference to FIG. 3, a computation device according to an embodiment of this invention comprises a matrix MTX of computation cells SC arranged into rows and columns and adapted to respectively output charge packets indicating the result of a computation operation performed. The cells in each row are connected electrically with their outputs together and to a row line RL; the cells in each column are connected electrically with their inputs together and to a column line CL. For each row, there is at least one charge injection circuit of the type described which is connected electrically with its output to a corresponding row line RL.

Information is supplied for processing to the lines CL in the form of an electric signal. The cells SC carry out the computation operation for which they have been set and supply the result in the form of charge packets on the lines RL; the injection circuits are activated at each computation operation and contribute with respective charge packets to correcting the result. The main reasons which correction becomes necessary include: the computation errors inherent to the cells SC, the errors in resetting the charge integrating circuit INT, and the voltage drops along the lines CL. Since in general the correction requirements would vary between lines, and between devices, the correction must be programmed for each device each time that the computation to be performed by the cell matrix is programmed, by programming the threshold voltages of the MOS transistors that make up the various injection circuits, for example. For a fixed computation, the correction may be programmed at the factory following production at the EWS (Electric Wafer Sort).

For a specific application similar to that shown in FIG. 4 of the aforementioned A Kramer's article, each line RL is connected to a corresponding node ND; "n" lines and only the first node ND-1 are shown in FIG. 3. For each line RL, and therefore, each node ND, there is a corresponding integration circuit INT connected thereto. Shown in FIG. 3 is only the first integration circuit INT-1. The outputs of all of the "n" integration circuits INT-1 . . . INT-n are connected to the input of a WTA "Winner-Take-All" circuit of a type which is well known in the information neural processing field and serves to determine and signal to the output which of the voltage signals presented at the outputs of the integration circuits has the highest value.

In the scheme of FIG. 3, for each line RL there is just one pair DB of MOS transistors because the generators G1 and G2 can advantageously be shared by several injection circuits. Each line RL comprises two electric connections, as shown in FIG. 4, being arranged geometrically in parallel across the full width of the matrix MTX and connected to each other and to a node ND at only one end through switches, SW2 and SW3 in FIG. 4. Each line CL comprises two electric connections CL-M1 and CL-M2, one for each MOS transistor in the pair DB, as shown in FIG. 4, being arranged geometrically in parallel through the height of the matrix MTX.

A similar device, according to this invention, can be obtained by reversing rows and columns, respectively; thus, there would be at least one charge injection circuit according to this invention per column.

In general in a computation device according to the invention, each computation cell SC has a first number of inputs and a second number of outputs, each row line RL corresponds to the first or the second number of electric connections, and each column line CL corresponds to the second number or the first number of electric connections.

The present invention may have various alterations, modifications and improvements which are readily apparent to a person skilled in the art. Any such alterations, modifications and improvements are intended to be part of the disclosure and to be within the spirit and scope of the present invention. Accordingly, the foregoing description is only by way of example and not intended to be limiting. The present invention is only limited by the enclosed claims and equivalences thereof.

What is claimed is:

1. A charge injection circuit, comprising:
   at least one pair of non-volatile MOS transistors having source and drain terminals which are coupled together and to an injection node; and
   at least one corresponding pair of generators for generating substantially step-like voltage signals each having an initial value and a final value, and having outputs respectively coupled to the control terminals of said transistors;
   wherein said generators are such that the initial value of a first of said signals is substantially equal to the final value of a second of said signals, and that the final value of the first signal is substantially equal to the initial value of the second signal.

2. The circuit according to claim 1, further comprising bias circuitry connected to said node and effective to hold it at a substantially constant potential.

3. The circuit according to claim 2, wherein said bias circuitry comprises an operational amplifier and an electric network, specifically a capacitor, connected thereto in negative feedback relationship, and wherein said node is connected to an inverting input of said amplifier.

4. The circuit according to claim 1, wherein said generators are effective to generate said signals in a synchronous manner.

5. The circuit according to claim 1, wherein each of said generators is adapted to respectively receive, at two inputs thereof, two reference potentials, and comprising switches operative to alternately couple the output to said inputs.

6. The circuit according to claim 1, further comprising program circuitry for said transistors which is controllably effective to uncouple them from said node and couple them to program references.

7. The circuit according to claim 1, wherein the range of values delimited by said initial and final values of said signals contains the values of the threshold voltages of said transistors.

8. The circuit according to claim 1, wherein said MOS transistors have their floating gate extended outside the channel area in the vertical direction relative to the channel length, but substantially non-overlapping the source and drain areas.

9. A charge injection circuit for canceling the effects of parasitic capacitance, comprising:

two matched non-volatile transistors each having a source, a gate and a drain, the sources coupled to one another and to a charge injection node, the drains coupled to one another and to the charge injection node, and each non-volatile transistor having a threshold voltage; and a voltage generator pair having a first and a second output, each of the outputs coupled to a respective gate of the non-volatile transistors, the voltage generator pair adapted to generate a first voltage signal on the first output and a second voltage signal on the second output, each voltage signal having a starting and a finishing voltage value such that the threshold voltage of each of the non-volatile transistors is between the starting and finishing voltage values.

10. The charge injection circuit of claim 9 wherein the threshold voltage of the non-volatile transistors is programmable.

11. The charge injection circuit of claim 10 further comprising:

a programming circuit coupled between programming voltages and the non-volatile transistors, the programming circuit structured to inject electrons into and extract electrons from a floating gate of the respective non-volatile transistors, and structured to disconnect the non-volatile transistors from the charge injection node.

12. The charge injection circuit of claim 9 wherein the starting voltage of the first voltage signal is the same as the finishing voltage of the second voltage signal.

13. The charge injection circuit of claim 9 wherein the starting voltage of the second voltage signal is the same as the finishing voltage of the first voltage signal.

14. The charge injection circuit of claim 9 wherein the voltage generator pair is structured to change the first voltage signal from the starting voltage to the finishing voltage during the same time that the second voltage signal is changing from the finishing voltage to the starting voltage.

15. A method of operating a charge injection circuit, comprising:

programming a threshold voltage for a set of non-volatile transistors to a desired level;

coupling the set of non-volatile transistors to an injection node;

generating first voltage signals that include a first and a second voltage level;

applying the first voltage signals to gates of the programmed non-volatile transistors;

generating second voltage signals by changing the first voltage level to the second level and changing the second voltage level to the first level; and applying the second voltage signals to the gates of the programmed non-volatile transistors.

16. The method of claim 15 further comprising holding the injection node at a constant potential.

17. The method of claim 16 wherein holding the injection node at a constant potential comprises coupling the injection node to a negative feedback connected operational amplifier.

* * * * *